(12) United States Patent
Corisis et al.

(10) Patent No.: US 8,441,132 B2
(45) Date of Patent: May 14, 2013

(54) PACKAGED MICROELECTRONIC DEVICES RECESSED IN SUPPORT MEMBER CAVITIES, AND ASSOCIATED METHODS

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/399,659

(22) Filed: Feb. 17, 2012

(65) Prior Publication Data

US 2012/0146239 A1    Jun. 14, 2012

Related U.S. Application Data

(62) Division of application No. 11/452,750, filed on Jun. 13, 2006, now Pat. No. 8,202,754.

(30) Foreign Application Priority Data

Mar. 29, 2006  (SG) ................ 200602089-5

(51) Int. Cl.
*H01L 23/48*  (2006.01)
(52) U.S. Cl.
USPC ............ 257/774; 257/E23.011; 438/51
(58) Field of Classification Search .......... 257/774, 257/777, E23.011; 438/51
See application file for complete search history.

(56) References Cited

U.S. PATENT DOCUMENTS

| | | |
|---|---|---|
| 5,128,831 A | 7/1992 | Fox, III et al. |
| 5,252,857 A | 10/1993 | Kane et al. |
| 5,518,957 A | 5/1996 | Kim |
| 5,593,927 A | 1/1997 | Farnworth et al. |
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Wood et al. |
| 5,851,845 A | 12/1998 | Wood et al. |
| 5,883,426 A | 3/1999 | Tokuno et al. |
| 5,891,753 A | 4/1999 | Akram |
| 5,893,726 A | 4/1999 | Farnworth et al. |
| 5,898,224 A | 4/1999 | Akram |
| 5,933,713 A | 8/1999 | Farnworth |

(Continued)

FOREIGN PATENT DOCUMENTS

EP     1089336 B1    2/2008

OTHER PUBLICATIONS

Search Report and Written Opinion for Singapore Application No. 200602089-5, Sep. 29, 2008.

*Primary Examiner* — Tony Tran
(74) *Attorney, Agent, or Firm* — Perkins Coie LLP (57) ABSTRACT

Packaged microelectronic devices recessed in support member cavities, and associated methods, are disclosed. Method in accordance with one embodiment includes positioning a microelectronic device in a cavity of a support member, with the cavity having a closed end with a conductive layer, and an opening through which the cavity is assessable. The microelectronic device can have bond sites, a first surface, and a second surface facing opposite from the first surface. The microelectronic device can be positioned in the cavity so that the second surface faces toward and is carried by the conductive layer. The method can further include electrically coupling the bond sites of the microelectronic device to the conductive layer. In particular embodiments, the microelectronic device can be encapsulated in the cavity without the need for a releasable tape layer to temporarily support the microelectronic device.

21 Claims, 6 Drawing Sheets

U.S. PATENT DOCUMENTS

| | | | |
|---|---|---|---|
| 5,938,956 A | 8/1999 | Hembree et al. |
| 5,946,553 A | 8/1999 | Wood et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,072,233 A | 6/2000 | Corisis et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,150,717 A | 11/2000 | Wood et al. |
| 6,159,764 A | 12/2000 | Kinsman et al. |
| 6,172,419 B1 | 1/2001 | Kinsman |
| 6,175,149 B1 | 1/2001 | Akram |
| 6,184,465 B1 | 2/2001 | Corisis |
| 6,198,172 B1 | 3/2001 | King et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,225,689 B1 | 5/2001 | Moden et al. |
| 6,228,548 B1 | 5/2001 | King et al. |
| 6,229,202 B1 | 5/2001 | Corisis |
| 6,235,554 B1 | 5/2001 | Akram et al. |
| 6,246,108 B1 | 6/2001 | Corisis et al. |
| 6,252,308 B1 | 6/2001 | Akram et al. |
| 6,258,623 B1 | 7/2001 | Moden et al. |
| 6,258,624 B1 | 7/2001 | Corisis |
| 6,259,153 B1 | 7/2001 | Corisis |
| 6,277,671 B1 | 8/2001 | Tripard |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,331,221 B1 | 12/2001 | Cobbley |
| 6,331,453 B1 | 12/2001 | Bolken et al. |
| 6,332,766 B1 | 12/2001 | Thummel |
| 6,365,434 B1 | 4/2002 | Rumsey et al. |
| 6,429,528 B1 | 8/2002 | King et al. |
| 6,451,709 B1 | 9/2002 | Hembree |
| 6,548,376 B2 | 4/2003 | Jiang |
| 6,548,757 B1 | 4/2003 | Russell et al. |
| 6,552,910 B1 | 4/2003 | Moon et al. |
| 6,558,600 B1 | 5/2003 | Williams et al. |
| 6,560,117 B2 | 5/2003 | Moon et al. |
| 6,561,479 B1 | 5/2003 | Eldridge |
| 6,564,979 B2 | 5/2003 | Savaria |
| 6,576,494 B1 | 6/2003 | Farnworth |
| 6,576,495 B1 | 6/2003 | Jiang et al. |
| 6,589,820 B1 | 7/2003 | Bolken |
| 6,607,937 B1 | 8/2003 | Corisis |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |
| 6,653,173 B2 | 11/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,746,894 B2 | 6/2004 | Fee et al. |
| 2001/0016370 A1 | 8/2001 | Ho |
| 2005/0224956 A1 | 10/2005 | Kao et al. |
| 2007/0069371 A1 | 3/2007 | Iksan et al. |
| 2007/0228577 A1 | 10/2007 | Corisis et al. |

PACKAGED MICROELECTRONIC DEVICES RECESSED IN SUPPORT MEMBER CAVITIES, AND ASSOCIATED METHODS

CROSS-REFERENCE TO RELATED APPLICATIONS

This application is a divisional of U.S. application Ser. No. 11/452,750 filed Jun. 13, 2006, which claims foreign priority benefits of Singapore Application No. 200602089-5 filed Mar. 29, 2006, each of which is incorporated herein by reference in its entirety.

TECHNICAL FIELD

The present disclosure is directed generally toward packaged microelectronic devices, including microelectronic dies, that are recessed in a cavity of a corresponding support member (e.g., a circuit board). The disclosure is also directed to associated methods.

BACKGROUND

Packaged microelectronic assemblies, such as memory chips, imagers, and microprocessor chips, typically include a microelectronic die mounted to a substrate and encased in a plastic protective covering or encapsulant. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

One approach for carrying a microelectronic die in a package is to support it on an interposer board or other type of circuit board. The interposer board can include a first set of bond pads to which the microelectronic die is electrically connected with wire bonds or solder balls. Conductive traces route electrical signals between the first set of bond pads and a second set of bond pads that are accessible from outside the package encapsulant for connections to other devices.

Customer demands have resulted in increasing pressure on manufacturers to make the encapsulated microelectronic die packages smaller. In response, some manufacturers have recessed the microelectronic die in the circuit board to reduce the thickness of the resulting package. One approach to recessing the microelectronic die is to (a) form a cavity extending entirely through the circuit board, (b) place a layer of a removable adhesive across one opening of the cavity, and then (c) temporarily support the die in the cavity with the adhesive while the die is electrically connected to the circuit board. The die is then encapsulated in the cavity, which both secures the die to the circuit board and protects the electrical connections between the die and the circuit board. The adhesive layer is then removed.

One potential drawback with the foregoing approach is that it requires the use of a removable adhesive layer to temporarily secure the die to the circuit board during manufacture. The operation of first attaching the removable adhesive layer and then detaching the removable adhesive layer can add to the overall flow time required to produce the microelectronic device package. This can in turn reduce the throughput of a package production line, and/or increase the cost of producing such packages.

DETAILED DESCRIPTION

The present disclosure relates generally to microelectronic device packages, including packages having a support member with a cavity and a microelectronic device carried by a conductive surface of the cavity. For example, a microelectronic device package in accordance with one aspect includes a support member having a cavity with a cavity opening and a closed end opposite the opening, with the closed end having a conductive layer. The package can further include a microelectronic device disposed in the cavity, with the microelectronic device having bond sites that are electrically coupled to the conductive layer. The microelectronic device can further have a first surface and a second surface facing opposite from the first surface, with the second surface facing toward and carried by the conductive layer in the cavity. The presence of the conductive layer at the closed end of the cavity can eliminate the need for a removable adhesive layer at that location during manufacture, and can also provide for electrical connections to the microelectronic device.

In particular aspects, the support member can include a first support member element having a conductive layer, and a second support member element having another conductive layer. An intermediate element can be positioned between the two support member elements. In further particular embodiments, each of the support member elements can include a circuit board. In still another aspect, the support member can carry multiple microelectronic devices stacked one upon the other. The microelectronic devices can be electrically isolated from each other within the package, or can be electrically coupled to each other within the package. When electrically isolated, each microelectronic device can be coupled to a corresponding set of device bond sites which may be positioned on the same side or on opposite sides of the package.

Further aspects are directed to methods for packaging a microelectronic device. One such method can include positioning a microelectronic device in a cavity of a support member. The cavity can have a closed end with a conductive layer, and an opening through which the cavity is accessible. The microelectronic device can have bond sites, a first surface, and a second surface facing opposite from the first surface, with the second surface facing toward and carried by the conductive layer. The method can further include electrically coupling the microelectronic device to the conductive layer. In particular aspects, the microelectronic device can be encapsulated without temporarily supporting the microelectronic device in the cavity with a removable tape layer.

In particular aspects, the support member can be formed from multiple support member elements. For example, the support member can include a first support member element having a conductive layer and a second support member element also having a conductive layer, and the method can further include attaching the first and second support member elements to each other with an intermediate element. The cavity can be made to extend entirely through the first support member element and the intermediate element, and can extend part-way through the second support member element, for example, to expose the conductive layer of the second support member element.

In a further aspect, the package can be made to include multiple microelectronic devices. For example, the support members can include first and second conductor layers, and a cavity with the second conductive layer at a closed end of the cavity. A first microelectronic device can be positioned in the cavity, and can have a first surface (with bond sites accessible from the first surface), and a second surface facing opposite from the first surface and positioned against the second conductive layer. A second microelectronic device can be stacked on the first microelectronic device in the cavity, and each microelectronic device can be electrically coupled to at least one of the conductive layers. For example, both microelectronic devices can be electrically coupled to the same conductive layer in one particular arrangement. In another arrangement, the first microelectronic device can be coupled to first package bond sites and the second microelectronic device can be coupled to second package bond sites, with the second package bond sites being electrically isolated from the first package bond sites.

Many specific details of particular embodiments are set forth in the following description and FIGS. 1A-6 to provide a thorough understanding of these embodiments. One skilled in the art, however, will understand that the present invention may have additional embodiments, and that the invention may be practiced without several of the details described below.

Figure 1A:
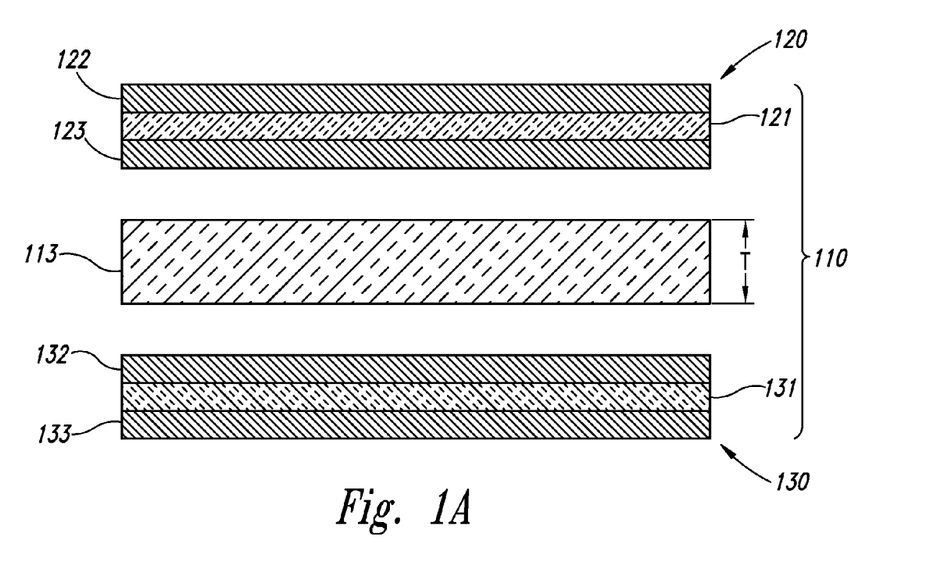
FIGS. 1A-1E are partially schematic side cross-sectional views illustrating a process for forming a support member having a cavity configured to receive a microelectronic device in accordance with an embodiment of the invention.

FIGS. 1A-1E illustrate a process for preparing a support member 110 that carries a microelectronic device (e.g., a microelectronic die) in accordance with an embodiment of the invention. FIG. 1A illustrates a support member 110 formed from an assembly of initially separate elements. These elements can include a first support member element 120, (referred to as a first element 120) a second support member element 130, (referred to as a second element 130) and an intermediate element 113 (e.g., an adhesive) that joins the first and second elements 120, 130 in a sandwich construction. Each of the first and second elements 120, 130 can include a circuit board. Accordingly, the first element 120 can include a first conductive layer 122 separated from a second conductive layer 123 by an insulating layer 121. The second element 130 can also include a first conductive layer 132 separated from a second conductive layer 133 by an insulating layer 131. The intermediate element 113 can include an epoxy (e.g., an epoxy sheet) or another adhesive material that is sandwiched between the first element 120 and the second element 130. In a particular aspect of this embodiment, the intermediate element 113 can have a thickness T selected to control the overall thickness of the assembled support member 110, as will be described in greater detail below with reference to FIG. 1D.

Figure 1B:
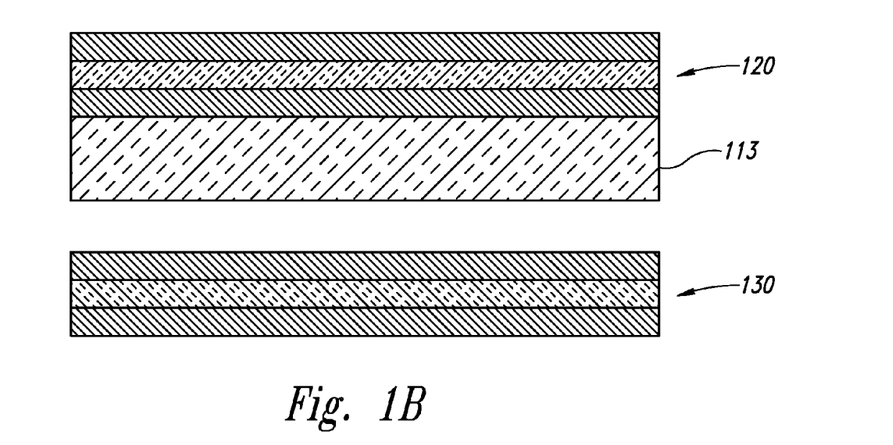

In FIG. 1B, the intermediate element 113 has been attached to the first element 120. The composite of the first element 120 and the intermediate element 113 can undergo an elevated temperature curing process to solidify the bond between these two elements. In other embodiments, the first element 120 and the intermediate element 113 can be attached to each other in a room temperature process.

Figure 1C:
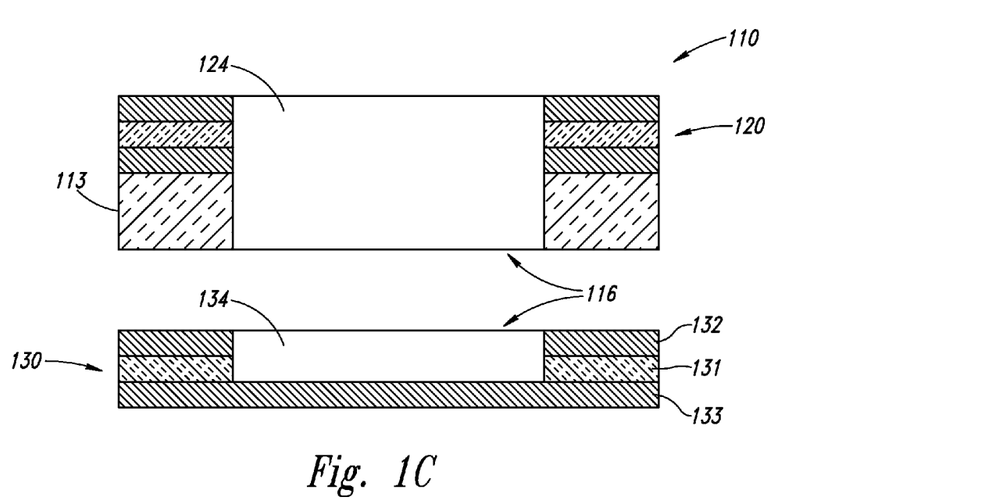

FIG. 1C illustrates the support member 110 after the formation of a cavity 116 in the elements that form the support member 110. The cavity 116 can include a first cavity portion 124 that extends through the first element 120 and the adjacent intermediate element 113. The cavity 116 can further include a second cavity portion 134 that extends part-way through the second element 130. Accordingly, the second cavity portion 134 can extend through the first conductive layer 132 and the insulating layer 131 of the second element 130, but not through the second conductive layer 133. In an embodiment shown in FIG. 1C, the cavity portions 124, 134 are formed in the separate sections of the support member 110 before the sections are joined. Accordingly, a relatively high-speed process (e.g., a punching process) can be used to form the first cavity portion 124. A different process (e.g., an etching process) can be used to form the second cavity portion 134. For example, a two-step etching process can be used to extend the second cavity portion 134 (a) through the first conductive layer 132 and then (b) through the insulating layer 131. An advantage of an embodiment that includes forming the first and second cavity portions 124, 134 separately is that is allows at least the first cavity portion 124 to be formed using a relatively high-speed process. However, in other embodiments, the entire cavity 116 can be formed after the second element 130 is joined to the intermediate element 113, for example, using a series of etching processes.

Figure 1D:
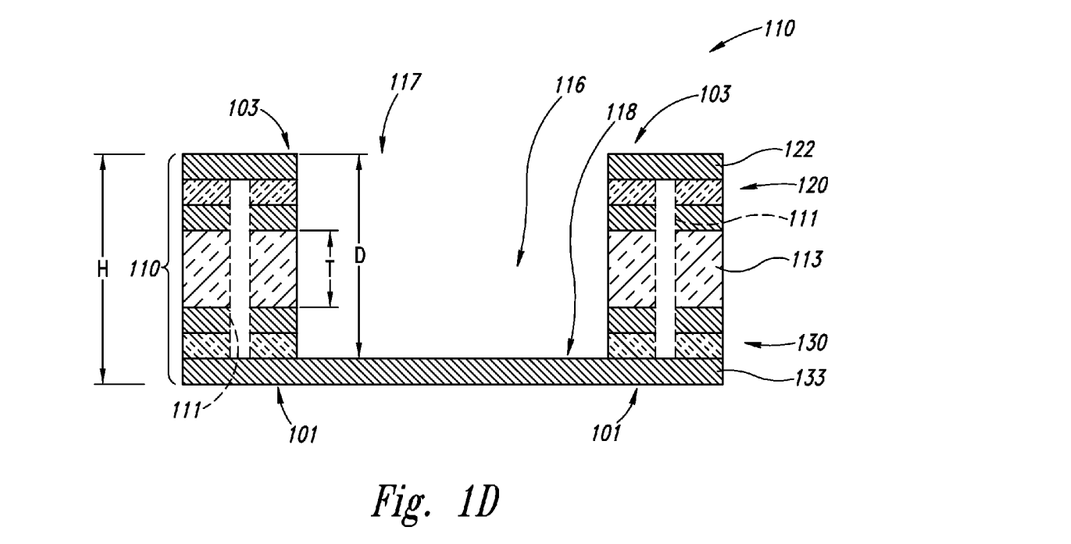

FIG. 1D illustrates the support member 110 after the second element 130 is joined to the composite formed by the first element 120 and the intermediate element 113. This attachment process can be generally similar to the process used to attach the first element 120 to the intermediate element 113. Once attached, the cavity 116 has an opening 117 and a closed end 118 opposite the opening 117. The closed end 118 is bounded by a conductive material, in this case, the second conductive layer 133 of the second element 130. The overall height H of the support member 110 can be controlled by selecting the thickness T of the intermediate element 113, once the thicknesses of the first and second elements 120, 130 have been established. In some embodiments, the overall height H can also be controlled by selecting the thicknesses of the first element 120 and/or the second element 130. The overall height H of the support member 110 can determine at least in part the depth D of the cavity 116, which in turn can determine the size and/or number of microelectronic devices that will fit in the cavity 116.

The first conductive layer 122 and/or the second conductive layer 133 can be patterned using existing etching techniques to form two sets of bond sites. For example, internal bond sites 103 can be formed in the first conductive layer 122 and can be positioned to be electrically connected to a microelectronic device that is subsequently positioned in the cavity 116. Package bond sites 101 can be formed in the second conductive layer 133 and can be positioned for coupling to external devices (not shown in FIG. 1D). Conductive vias 111 can be formed in the support member 110 (e.g., using existing etching and material deposition techniques) to connect the internal bond sites 103 to the package bond sites 101. The conductive vias 111 can accordingly provide signal paths between the first conductive layer 122 and the second conductive layer 133, and between the subsequently positioned microelectronic device and external devices.

Figure 1E:
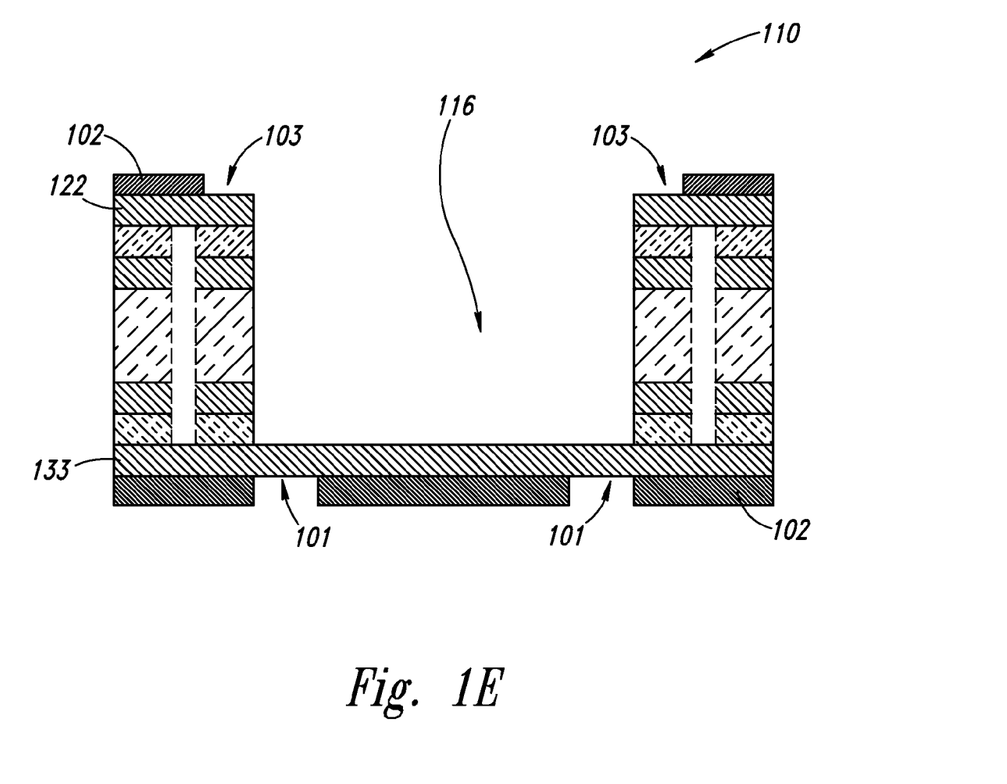

FIG. 1E illustrates the support member 110 after a solder mask 102 or other appropriate insulating layer has been disposed on the first conductive layer 122 and the second conductive layer 133. The solder mask 102 can be selectively etched away and/or formed in a manner so as to leave the internal bond sites 103 at the first conductive layer 122, and the corresponding package bond sites 101 at the second conductive layer 133 exposed for subsequent electrical connections.

Figure 2A:
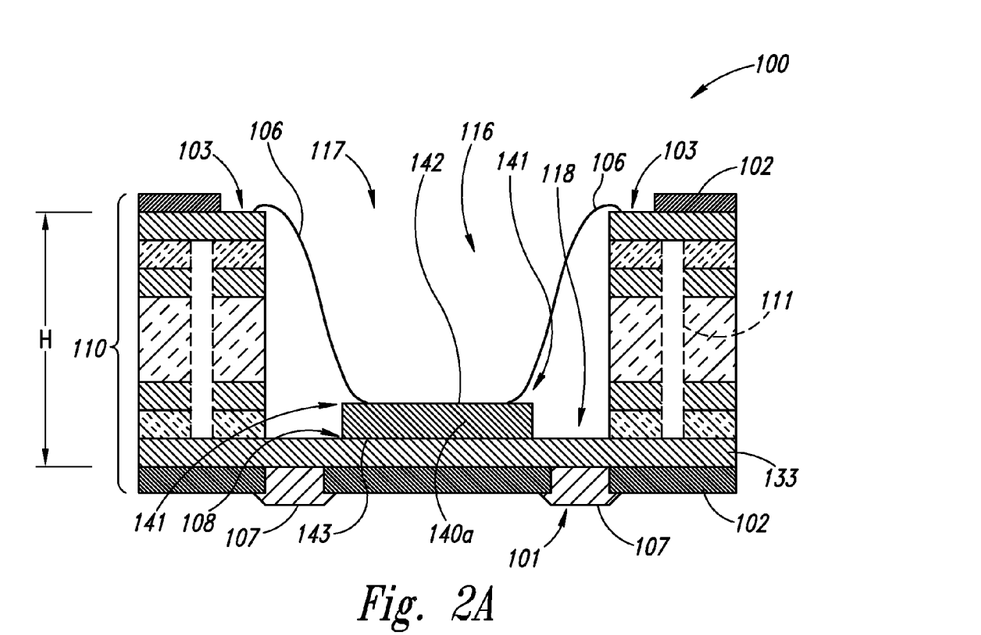
FIGS. 2A-2B are partially schematic, side cross-sectional views illustrating a process for mounting multiple microelectronic devices to a support member in accordance with an embodiment of the invention.
Figure 2B:
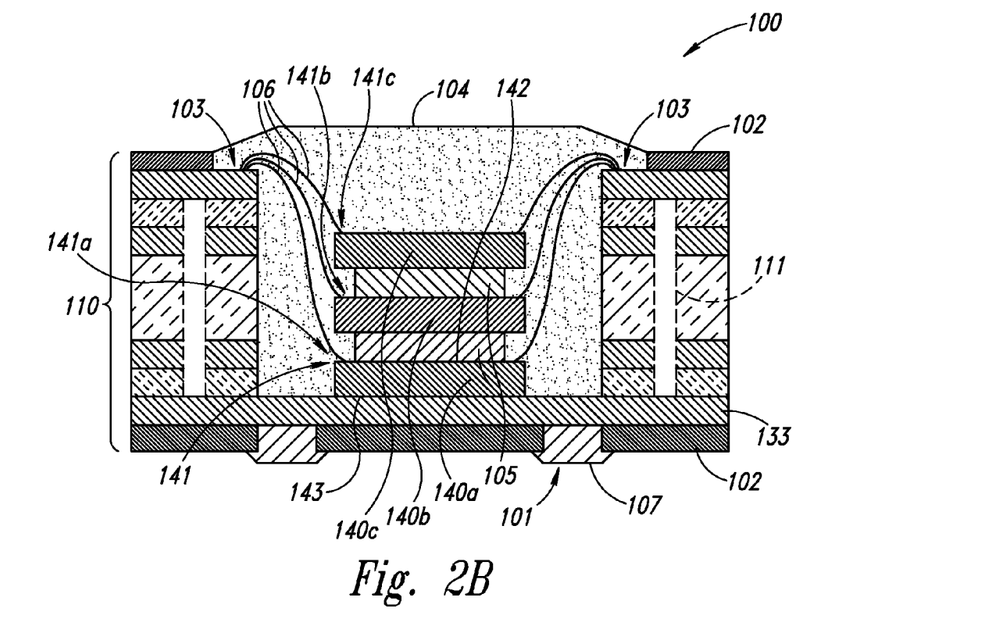

FIG. 2A illustrates the support member 110 after a first microelectronic device 140a has been positioned in the cavity 116. In this particular case, the support member 110 is configured to carry stacked microelectronic devices, as will be described in greater detail below with reference to 2B. The first microelectronic device 140a can include a microelectronic die, for example, a memory chip or a processor chip. Accordingly, the first microelectronic device 140a can include memory cells, capacitors, processor circuits and/or other functional internal microelectronic features.

The first microelectronic device 140a can have a first surface 142 facing outwardly toward the cavity opening 117 and a second surface 143 facing toward the closed end 118 of the cavity 116. Accordingly, the second surface 143 can be carried by the second conductive layer 133. In at least some embodiments, a thin die support adhesive 108 or adhesive layer is used to attach the first microelectronic device 140a to the second conductive layer 133. For example, the adhesive 108 can include an adhesive paste or die attach film having a thickness of from about 10 µm to about 25 µm. The adhesive 108 can be electrically insulating, or electrically conductive. For example, if the second surface 143 of the first microelectronic device includes a conductive ground plane, a conductive adhesive can be used to ground the device 140a to the second conductive layer 133. The second conductive layer 133 can be patterned to isolate the grounding portion of the layer from the signal-carrying bond pads 107.

The first microelectronic device 140a can include multiple device bond sites 141 accessible from the first surface 142. The device bond sites 141 can be connected to the corresponding internal bond sites 103 with wire bonds 106 or another suitable electrical coupling. As will be clear to one of ordinary skill in the relevant art, the first microelectronic device 140a can include multiple device bond sites 141 extending perpendicular to the plane of FIG. 2A, which are coupled to corresponding multiple internal bond sites 103, also extending perpendicular to the plane of FIG. 2A. Each internal bond site 103 can be electrically coupled to a corresponding package bond site 101 with a via 111, as described above. Each package bond site 101 can include a bond pad 107 or other appropriate provision for connecting the package 100 to external devices. The bond pads 107 can be arranged in a ball grid array, a land grid array, or another appropriate pattern, depending upon the particular use to which the package is intended to be put. Solder balls (not shown in FIG. 2B) can be used to electrically couple the bond pads 107 to external devices.

FIG. 2B illustrates the package 100 after additional microelectronic devices (including a second microelectronic device 140b and a third microelectronic device 140c) are stacked on the first microelectronic device 140a and attached with inter-die adhesive layers 105. These layers 105 can include epoxy, and can be thicker (e.g., 100 µm) than the die support adhesive 108. Each of the microelectronic devices 140a-140c can be connected with wire bonds 106 to corresponding internal bond sites 103. In one aspect of this embodiment, the microelectronic devices 140a-140c can share internal bond sites 103. For example, a given device bond site 141a of the first microelectronic device 140a can be coupled to an internal bond site 103, and the corresponding device bond sites 141b, 141c of the second microelectronic device 140b and the third microelectronic device 140c, respectively, can be coupled to the same internal bond site 103. This arrangement can be particularly suitable when the first, second and third microelectronic devices 140a-140c have identical or otherwise compatible configurations. When the microelectronic device configurations are identical, each successive microelectronic device completely overlays the microelectronic device beneath. Accordingly, the wire bonds 106 for a given microelectronic device are typically connected to the corresponding internal bond site 103 before the next microelectronic device is stacked on top. In other arrangements, such as that described below with reference to FIG. 3, the microelectronic devices may be stacked prior to connecting wire bonds to each device. In any of these embodiments, the wire bonds 106 and the microelectronic devices themselves can then be protected with an encapsulant 104.

One feature of an embodiment of the arrangement shown in FIG. 2B is that the first microelectronic device 140a is supported by the second conductive layer 133, both during manufacture and after the package 100 is completed. One expected benefit of this arrangement is that it does not require a removable tape layer to carry the first microelectronic device 140a (and any devices stacked on top of it) during manufacture, and such a tape layer need not subsequently be removed. Accordingly, the process for forming the package 100 (once the support member 110 has been manufactured) can be reduced when compared with existing processes that include the use of a removable tape layer during the package formation process.

Another potential benefit of the second conductive layer 133 is that it can transfer additional heat away from the package 100, and in particular, away from the first microelectronic device 140a. More specifically, the electrically conductive layer of the closed end of the cavity in the support member conducts heat away from the first microelectronic device 140a. Increasing the amount of heat transferred away from the package 100 can increase the expected lifetime of the package 100, and can reduce the likelihood for package failures. Increasing the heat transfer rate is particularly important for high-performance devices that operate at higher speeds. This feature can also allow the package to be used in harsher thermal environments.

Still another expected benefit of the second conductive layer 133 is that it can protect the second surface 143 of the first microelectronic device 140a. In other existing packages, the second surface 143 can remain exposed after the temporary tape layer described above has been removed. In some cases, the exposed second surface 143 may increase the likelihood for damage to the first microelectronic device 140a. In other existing arrangements, an additional protective material is placed against the exposed second surface 143. However, an embodiment of the current method can provide such protection without the additional step of adding a protective layer.

Yet another expected benefit of the foregoing arrangement is that the first and second elements 120, 130 can be formed using existing printed circuit boards having the structure shown in FIG. 1A, along with existing processing techniques for attaching the printed circuit boards to each other, patterning the conductive layers of the printed circuit boards, and forming vias to connect the conductive layers. Accordingly, embodiments of the foregoing method can be implemented without the need for significantly tailored and/or specialized manufacturing techniques.

Figure 3:
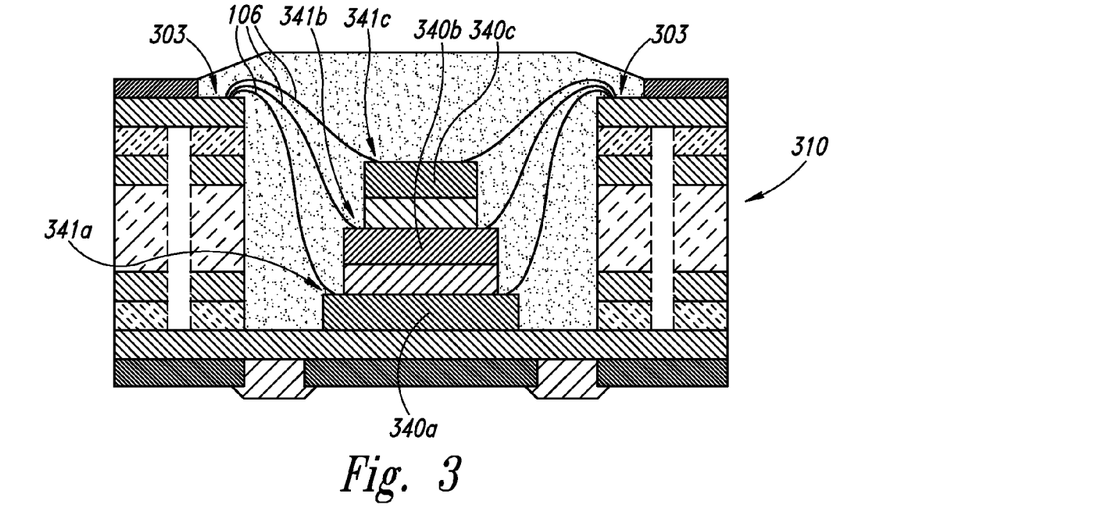
FIG. 3 is a partially schematic, side cross-sectional view of a package having multiple microelectronic devices with different configurations carried by a support member in accordance with another embodiment of the invention.

FIGS. 3-6 illustrate device packages having arrangements in accordance with further embodiments of the invention, all of which use some or all of the techniques and arrangements described above with reference to FIGS. 1A-2B. For example, FIG. 3 illustrates a package 300 having a support member 310 generally similar to the support member 110 shown in FIG. 1E. The support member 310 carries first, second and third microelectronic devices 340a, 340b, and 340c, each of which may have a different size and/or configuration. In one aspect of this arrangement, the first microelectronic device 340a has a larger planform footprint than the second microelectronic device 340b, which in turn has a larger planform footprint than the third microelectronic device 340c. Because the device bond sites 341a-341c of each microelectronic device 340a-340c are laterally offset from the device bond sites of the microelectronic device immediately above, all three devices 340a-340c can be stacked on each other prior to wire bonding any of the microelectronic devices 340a-340c to corresponding internal bond sites 303. An advantage of this arrangement is that it can reduce the time required to form the package 300 because multiple similar steps can be performed sequentially at one processing station without moving the package 300 back and forth multiple times between processing stations. For example, all three microelectronic devices 340a-340c can be stacked while the package remains at a stacking station, and all three microelectronic devices 340a-340c can be wire bonded while the package 300 remains at a wire bonding station.

In one aspect of an embodiment shown in FIG. 3, similar, identical, or otherwise related device bond sites 341 can be coupled to a corresponding single internal bond site 303. In other embodiments, the package 300 may include multiple internal bond sites 303, all at the first conductive layer 322, and each dedicated to a corresponding device bond site 341 of one of the microelectronic devices 340a-340c. Further details of another arrangement in which individual microelectronic devices may be coupled to corresponding individual bond sites are described below with reference to FIGS. 4 and 5.

Figure 4:
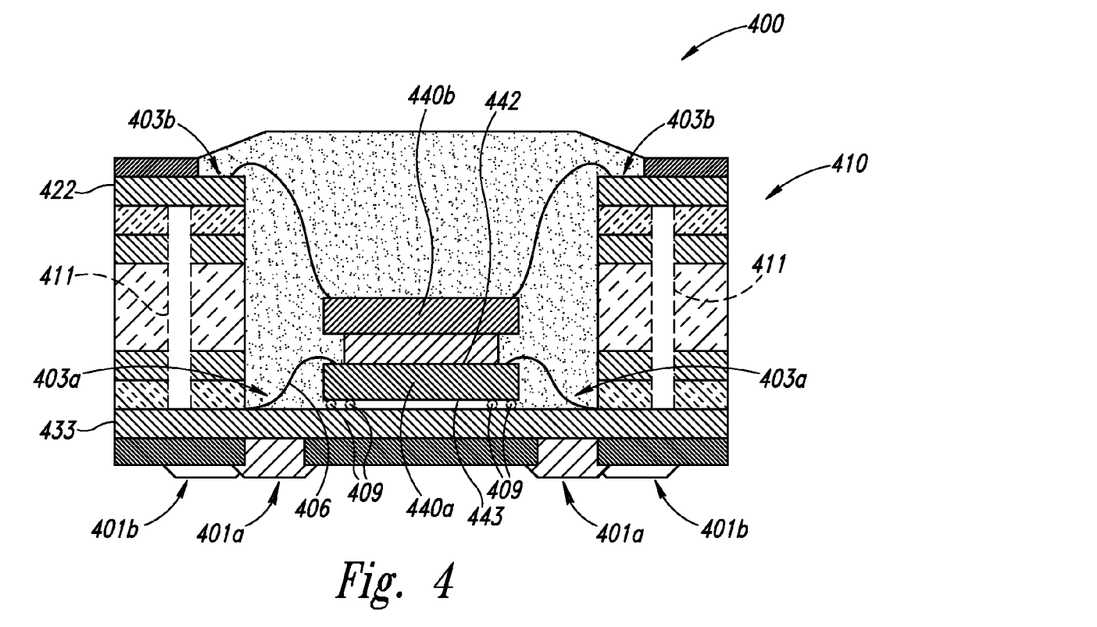
FIG. 4 is a partially schematic, side cross-sectional view of a package having two microelectronic devices with independent package bond sites, in accordance with yet another embodiment of the invention.

FIG. 4 illustrates a package 400 that includes a support member 410 carrying a first microelectronic device 440a, and a stacked second microelectronic device 440b. The first microelectronic device 440a can be coupled to first package bond sites 401a, and the second microelectronic device 440b can be coupled to second package bond sites 401b that are electrically isolated from the first package bond sites 401a. Accordingly, electrical signals can be sent to and from the first microelectronic device 440a independently of signals sent to and from the second microelectronic device 440b.

In one aspect of an embodiment shown in FIG. 4, the support member 410 can include a first conductive layer 422 and a second conductive layer 433. The first microelectronic device 440a can be electrically coupled to first internal bond sites 403a located at the second conductive layer 433, e.g., with wire bonds 406 or other suitable couplers. The second conductive layer 433 can be patterned to provide an electrical signal path between the first internal bond sites 403a and corresponding first package bond sites 401a, also located at the second conductive layer 433. The second microelectronic device 440b can be electrically coupled to second internal bond sites 403b located at the first conductive layer 422. The first conductive layer 422 can be patterned and coupled with appropriate vias 411 to corresponding second package bond sites 401b located at the second conductive layer 433. The electrical signal path between the first package bond sites 401a and the first microelectronic device 440a can be electrically isolated from the electrical signal path between the second package bond sites 401b and the second microelectronic device 440b. Accordingly, signals may be transmitted to and from the first microelectronic device 420a independently of signals transmitted to and from the second microelectronic device 420b. A similar arrangement can be used to provide independent signal paths to more (e.g., three) microelectronic devices carried by a single support member.

FIG. 4 also illustrates (in dashed lines) another embodiment in which electrical connections to the first microelectronic device 440a may be made with solder balls 409. The solder balls 409 can be positioned between the second conductive layer 433 and bond sites that are accessible from a downwardly facing second surface 443 of the first microelectronic device 440a, rather than the upwardly facing first surface 442. The second conductive layer 433 can both carry the first microelectronic device 440a and provide electrical signal paths to the first microelectronic device 440a.

Figure 5:
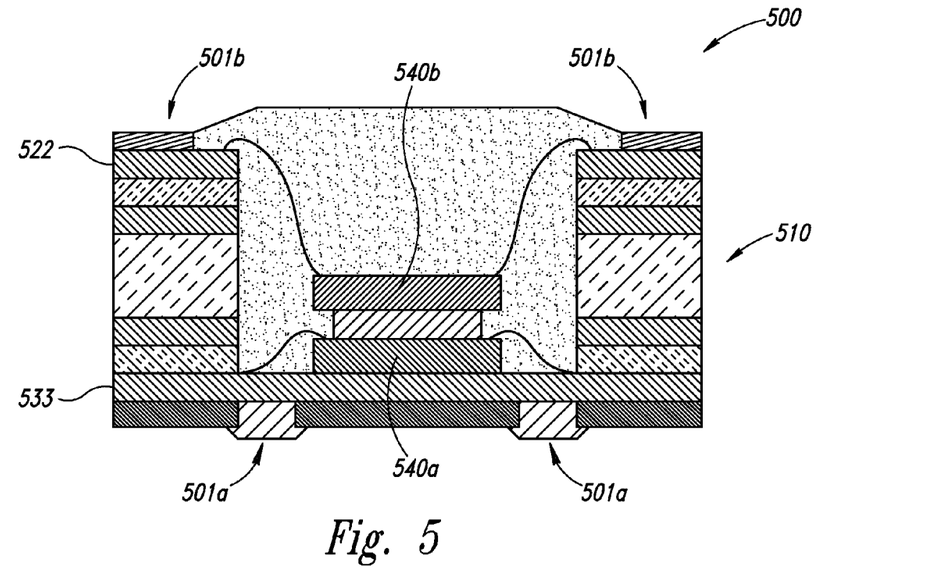
FIG. 5 is a partially schematic, side cross-sectional view of a package having two microelectronic devices and corresponding package bond sites facing in opposing directions.

In one aspect of an arrangement shown in FIG. 4, the first package bond sites 401a and the second package bond sites 401b are all accessible from the same side (e.g., the downwardly facing side) of the package 400. FIG. 5 illustrates a package 500 arranged so that the package bond sites for different dies within the package 500 are accessible from different directions. In particular, the package 500 can include a support member 510 having a first conductive layer 522 and a second conductive layer 533. A first microelectronic device 540a can be electrically connected with wire bonds to first package bond sites 501a located at the second conductive layer 533. A second microelectronic device 540b can be connected with wire bonds to second package bond sites 501b located at the first conductive layer 522. As is shown in FIG. 5, the first package bond sites 501a and the second package bond sites 501b are accessible from opposite sides of the package 500.

Figure 6:
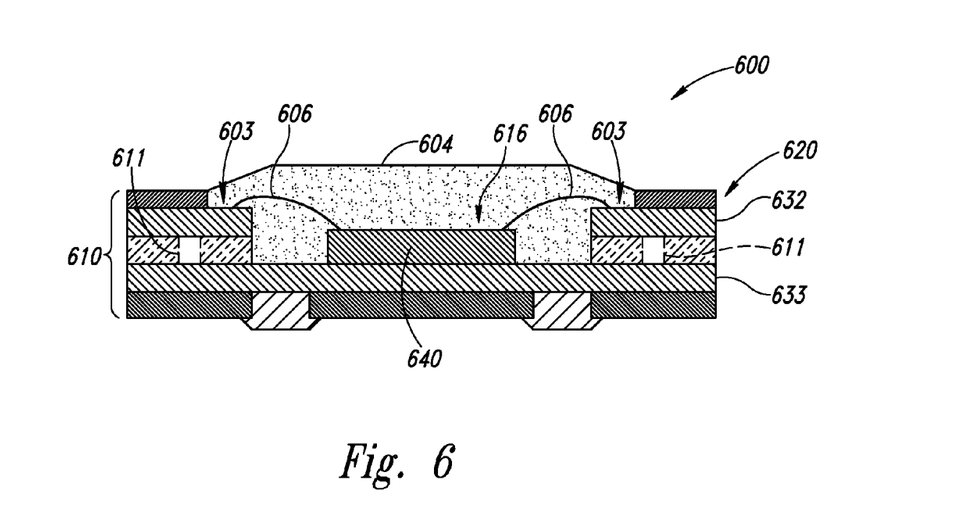
FIG. 6 is a partially schematic, side cross-sectional view of a package having a single microelectronic device recessed in a cavity formed in a single support member element, in accordance with still another embodiment of the invention.

The arrangements described above with reference to FIGS. 1A-5 illustrate support members formed from multiple elements and configured to carry multiple microelectronic devices. In other embodiments, the support member may be formed from a single element, and/or may carry only a single microelectronic device. FIG. 6 illustrates a package 600 that includes both a single-element support member 610 and a single microelectronic device 640. In one aspect of this arrangement, the support member 610 can include a single support member element 620 (e.g., a single circuit board) having a first conductive layer 632, a second conductive layer 633, and an insulating layer 621 between the first and second conductive layers 622, 633. Vias 611 can provide for electrical coupling between the two conductive layers 622, 633. A cavity 616 can be formed in the support member 610 using an etching technique or another appropriate technique. The microelectronic device 640 can be positioned in the cavity 610 so that it is placed against the second conductive layer 633. The microelectronic device 640 can then be coupled to corresponding internal bond sites 603 with wire bonds 606 or other appropriate electrical couplings. In a particular aspect of this embodiment, the microelectronic device 640 can be shorter than the walls of the cavity 616, so as not to project above the cavity 616. In other embodiments, the microelectronic device 640 can project above the cavity 616, so long as a corresponding encapsulant 604 can still be positioned to protect the wire bonds 606 and the connections between the wire bonds and both the microelectronic device 640 and the support member 610.

An advantage of an embodiment of the single-element support member 610 shown in FIG. 6 is that it may be simpler and therefore faster and/or less expensive to manufacture than are multi-element support members. The single-element support member may, in at least some embodiments, be thinner than a multi-element support member, and may therefore be particularly appropriate for packages having thin single dies or thin multi-die stacks. Conversely, embodiments of the multi-element support members may be particularly appropriate for thicker dies and/or die stacks.

Although advantages associated with certain embodiments of the invention have been described in the context of those embodiments, other embodiments may also exhibit such advantages. For example, at least some advantages described above with reference to FIGS. 1A-2B may apply as well to embodiments described with reference to FIGS. 3-6. Additionally, none of the foregoing embodiments need necessarily exhibit such advantages for fall within the scope of the invention. Aspects of certain embodiments described above may be combined or eliminated in other embodiments. For example, certain aspects described in detail with reference to FIGS. 1A-2B may be included in embodiments shown in FIGS. 3-6.

From the foregoing, it will be appreciated that specific embodiments of the invention have been described herein for purposes of illustration, but that various modifications may be made without deviating from the scope of the invention. For example, the microelectronic devices and corresponding support members can have configurations other than those shown in the Figures. In particular embodiments, electrical couplings other than the wire bonds may be used to electrically couple the microelectronic devices to bond sites internal to the package, and/or couplings other than solder balls may be used to connect the resulting package to external devices. Couplings that include any combination of wire bonds, vias, patterned layers, and/or other features may be used to electrically couple microelectronic devices to externally-accessible package bond sites. Accordingly, the invention not limited except as by the appended claims.

We claim:

1. A microelectronic device package, comprising:
   a first member comprising a first conductive material, a second conductive material, and a first insulating material sandwiched between the first conductive material and the second conductive material, wherein the first member has a first cavity portion extending directly through apertures in first conductive material, the first insulating material, and the second conductive material;
   a second member comprising a third conductive material, a fourth conductive material, and a second insulating material sandwiched between the third conductive material and the fourth conductive material, wherein the second member has a second cavity portion extending directly through apertures in the third conductive material and the second insulating material but not through the fourth conductive material, wherein the fourth conductive material is contiguous, wherein the fourth conductive material forms a closed end of the second cavity portion, and wherein the sandwich construction of the first member is oriented in a generally stacked arrangement relative to the sandwich construction of the second member;
   an intermediate member between the first member and the second member, the intermediate member having an opening generally aligned with the first and second cavity portions, wherein the first cavity of the first member, the opening of the intermediate member and the second cavity of the second member are generally aligned; and
   a microelectronic device having a first side and a second side opposite from the first side, the second side carried by the fourth conductive material of the second member at least partially within the second cavity portion, wherein the microelectronic device has bond sites on the first side, wherein the bond sites are electrically coupled to the fourth conductive material.

2. The microelectronic device package of claim 1, further comprising an adhesive attached between the second surface of the microelectronic device and the fourth conductive layer.

3. The microelectronic device package of claim 1, further comprising an encapsulant over at least a portion of the microelectronic device in the second cavity portion.

4. The microelectronic device package of claim 1 wherein the microelectronic device is connected to an intermediate conductive structure that is in turn electrically coupled to the fourth conductive material.

5. The microelectronic device package of claim 1 wherein the first cavity portion and second cavity portion together are deeper than a corresponding dimension of the microelectronic device.

6. The microelectronic device package of claim 1 wherein the intermediate member includes a circuit board.

7. The microelectronic device package of claim 1, further comprising at least one of an electrically conductive via electrically connected between the first and second conductive materials and an electrically conductive via electrically connected between the third and fourth conductive materials.

8. The microelectronic device package of claim 1 wherein the microelectronic device is a first microelectronic device, and wherein the microelectronic device package further comprises a second microelectronic device stacked on the first microelectronic device in at least one of the first cavity portion and the second cavity portion.

9. The microelectronic device package of claim 8, wherein both the first and second microelectronic devices are electrically coupled to the fourth conductive layer.

10. The microelectronic device package of claim 1 wherein the microelectronic device is electrically coupled to the fourth conductive layer with a wire bond.

11. A microelectronic device package, comprising:
    a support member having a cavity with an opening, a closed end opposite the opening, and a contiguous conductive material at the closed end, the support member including:
    a first support member element comprising a first conductive material, a second conductive material, and a first insulating material positioned between the first and second conductive materials, the first support member element having a first aperture extending directly through the first conductive material, the first insulating material, and the second conductive material; and
    a second support member element having a third conductive material, a fourth conductive material, and a second insulating material positioned between the third conductive material and the fourth conductive material, the second support member element being attached to the first support member element and having a second aperture extending directly through the third conductive material and the second insulating material, the first and second apertures being substantially axially aligned to form the cavity;
    a first microelectronic device disposed in the cavity, the first microelectronic device having a first surface with bond sites accessible from the first surface and electrically coupled to the fourth conductive material, the microelectronic device further having a second surface facing opposite from the first surface, the second surface facing toward and carried by the fourth conductive material in the cavity; and
    a second microelectronic device stacked on the first microelectronic device.

12. The microelectronic device package of claim 11 wherein the first and second microelectronic devices are electrically coupled to each other.

13. The microelectronic device package of claim 11, further comprising:
first package bond sites positioned to couple the microelectronic device package to external devices, the first package bond sites being electrically coupled to the first microelectronic device via a first signal path; and
second package bond sites positioned to couple the microelectronic device package to external devices, the second package bond sites being electrically coupled to the second microelectronic device via a second signal path that is electrically isolated from the first signal path.

14. The microelectronic device package of claim 13 wherein the first and second package bond sites are accessible from the same side of the microelectronic device package.

15. The microelectronic device package of claim 13 wherein the first and second package bond sites are accessible from the opposite sides of the microelectronic device package.

16. The microelectronic device package of claim 11, further comprising:
first package bond sites positioned to couple the microelectronic device package to external devices, the first package bond sites being electrically coupled to the first microelectronic device; and
second package bond sites positioned to couple the microelectronic device package to external devices, the second package bond sites being electrically coupled to the second microelectronic device and being located at the same conductive material as the first package bond sites.

17. The microelectronic device package of claim 11, further comprising an intermediate element positioned between the first and second support members.

18. The microelectronic device package of claim 11 wherein the first and second microelectronic devices are electrically coupled to each other.

19. The microelectronic device package of claim 11, further comprising a third microelectronic device stacked on the second microelectronic device in the cavity.

20. The microelectronic device package of claim 11, wherein the first and second microelectronic devices have at least approximately the same shape and configuration.

21. The microelectronic device package of claim 11, wherein the first and second microelectronic devices have different shapes, configurations, or both.

* * * * *